United States Patent [19]
Mukohzaka

[11] Patent Number: 4,974,202
[45] Date of Patent: Nov. 27, 1990

[54] OPTICAL ASSOCIATIVE MEMORY EMPLOYING AN AUTOCORRELATION MATRIX

[75] Inventor: Naohisa Mukohzaka, Shizuoka, Japan

[73] Assignee: Hamamatsu Photonics K.K., Shizuoka, Japan

[21] Appl. No.: 430,055

[22] Filed: Oct. 31, 1989

Related U.S. Application Data

[63] Continuation of Ser. No. 203,909, Jun. 8, 1988, abandoned.

[30] Foreign Application Priority Data

Jun. 10, 1987 [JP] Japan .............................. 62-144351

[51] Int. Cl.[5] .................... G11C 13/00; G06F 15/336; G06G 7/195

[52] U.S. Cl. .................................... 365/49; 365/45; 364/604

[58] Field of Search .................... 365/49, 45; 364/822, 364/845, 604, 518; 382/14, 15, 42; 381/43

[56] References Cited

U.S. PATENT DOCUMENTS

| | | | |
|---|---|---|---|
| 3,492,652 | 1/1970 | Van Heerden | 340/172.5 |
| 3,766,533 | 10/1973 | Black et al. | 340/172.5 |
| 3,868,655 | 2/1975 | Filippazzi | 340/173 AM |
| 4,017,853 | 4/1977 | Brandao et al. | 365/49 |
| 4,325,257 | 4/1982 | Kino et al. | 364/604 |
| 4,446,425 | 5/1984 | Valdmanis et al. | 324/77 K |
| 4,449,193 | 5/1984 | Tournois | 364/604 X |
| 4,603,293 | 7/1986 | Mourou et al. | 324/96 |
| 4,618,819 | 10/1986 | Mourou et al. | 324/77 K |
| 4,651,293 | 3/1987 | Kato | 364/604 |
| 4,701,879 | 10/1987 | Scarr | 365/49 X |
| 4,739,496 | 4/1988 | Marom et al. | 365/49 |
| 4,748,674 | 5/1988 | Freeman | 382/14 |
| 4,750,153 | 6/1988 | Owechko et al. | 365/49 |

FOREIGN PATENT DOCUMENTS 0197196 10/1986 European Pat. Off. .

OTHER PUBLICATIONS

Psaltis et al, "Optical Information Processing Based on an Associative-Memory Model of Neural Nets with Thresholding and Feedback", Optics Letters, vol. 10, No. 2, Feb. 1985, pp. 98–100.

Farhat et al, "Optical Implementation of Associative Memory Based on Models of Neural Networks," Optical Signal Processing, Academic Press, Inc., 1987, pp. 129–162.

Warde et al, "Spatial Light Modulators," Optical Signal Processing, Academic Press, Inc., 1987, pp. 487–495.

"Electro-Optic Sampling: Testing Picosecond Electronics, Part 1, Principles and Embodiments", by Valdmanis et al, Laser Focus/Electro-Optics, Feb. 1986, pp. 84–96.

(List continued on next page.)

*Primary Examiner*—Stuart N. Hecker
*Assistant Examiner*—Alfonso Garcia
*Attorney, Agent, or Firm*—Finnegan, Henderson, Farabow, Garrett, and Dunner

[57] ABSTRACT

An optical associative memory produces an electrical correlation matrix pattern from an inputted electrical reference pattern and an electrical recall pattern, and converts the electrical correlation matrix pattern into a corresponding optical correlation matrix pattern, which is stored in a correlation matrix storage device. A reference pattern conversion device converts the electrical reference pattern into an optical reference pattern and a multiple image formation system converts the optical reference pattern to the other optical reference pattern. A pattern operation device produces an optical recall pattern by multiplying the optical correlation matrix pattern and the optical reference pattern. An inverse multiple image information system and a light receiving matrix convert the optical recall pattern into a corresponding electrical recall pattern, and the obtained electrical recall pattern is subjected to a thresholding operation. As a result, the recall pattern is obtained from the reference pattern after learning with a plurality of reference patterns through optical processing.

11 Claims, 4 Drawing Sheets

OTHER PUBLICATIONS

"Electro-Optic Sampling: Testing Picosecond Electronics, Part 2, Applications", by Valdmanis et al, Laser Focus/Electro-Optics, Mar. 1986, pp. 96-106.

"Noncontact Electro-Optic Sampling with a GaAs Injection Laser", by Nees et al, Electronics Letters, Aug. 14th, 1986, vol. 22, No. 17, pp. 918-919.

"Subpicosecond Electrical Sampling and Applications", by Valdmanis et al, Picosecond Optoelectronic Devices, 1984, pp. 249-270.

"Picosecond Electro-Electron Optic Oscilloscope", by Williamson et al, Proc. Conf. Picosecond Electron. Optoelectron (N.Y. Springer-Verlag, 1985), pp. 58-61.

"Electrooptic Sampling in GaAs Integrated Circuits", by Kolner et al, IEEE Jnl. of Quantum Electronics, vol. QE-22, No. 1, Jan. 1986, pp. 79-93.

"Subpicosecond Electrical Sampling", by Valdmanis et al, IEEE Jnl. of Quantum Elec., vol. QE-19, No. 4, Apr. 1983, pp. 664-667.

"Electro-Optic Sampling with Picosecond Resolution", by Kolner et al, Electronics Letters, Jul. 21st, 1983, vol. 19, No. 15, pp. 574-575.

"Advances in Streak Camera Instrumentation for the Study of Biological and Physical Processes", by Tsuchiya, IEEE Jnl. of Quantum Electronics, vol. QE-20, No. 12, Dec. 1974, pp. 1516-1528.

"High-Speed Optical Electronics: The Picosecond Optical Oscilloscope", by Valdmanis, Solid State Technology/Test & Measurement World, Nov. 1986, pp. 540-544.

"Subpicosecond Electrooptic Sampling: Principles and Applications", by Valdmanis et al, IEEE Jnl. of Quantum Elec., vol. QE-22, No. 1, Jan. 1986, pp. 69-78.

"Picosecond Electro-Optic Sampling System", by Valdmanis et al, Appl. Phys. Lett. 41(3), Aug. 1, 1982, pp. 211-212.

FIG. 5(A)

| | |
|---|---|
| 1 | 2 |
| 3 | 4 |

FIG. 5(B)

| | | | |
|---|---|---|---|
| 1 | 1 | 2 | 2 |
| 1 | 1 | 2 | 2 |
| 3 | 3 | 4 | 4 |
| 3 | 3 | 4 | 4 |

FIG. 6(A)

| | |
|---|---|
| 1 | 2 |
| 3 | 4 |

FIG. 6(B)

| | | | |
|---|---|---|---|
| 1 | 2 | 1 | 2 |
| 3 | 4 | 3 | 4 |
| 1 | 2 | 1 | 2 |
| 3 | 4 | 3 | 4 |

FIG. 7(A)

| | | | |
|---|---|---|---|
| a | b | c | d |
| e | f | g | h |
| i | j | k | l |
| m | n | o | p |

FIG. 7(B)

| | |
|---|---|
| a c<br>i k | b d<br>j l |
| e g<br>m o | f h<br>n p |

OPTICAL ASSOCIATIVE MEMORY EMPLOYING AN AUTOCORRELATION MATRIX

This application is a continuation of application Ser. No. 203,909, filed June 8, 1988, now abandoned.

FIELD OF THE INVENTION

The present invention relates to an optical associative memory.

BACKGROUND OF THE INVENTION

Conventional memories used in computers generally employ a method in which information stored in a memory is accessed by specifying the address corresponding to the location of the information in the memory. This type of memory device has a disadvantage in that data previously stored at a location may not be recovered once new information has been stored at the location. To solve this problem, associative memories have been developed wherein information is stored and searched on the basis of a reference input supplied from the outside. The reference input comprises part of the information stored or to be stored and all entries in the memory can be searched in one clock cycle.

Many associative memories have been developed and used as part of a computer memory, and are intended for storing electric digital signals. A scanning operation is necessitated when pattern information is involved, and this requires a much longer time in processing the data. It has been impossible to obtain outputs successively.

SUMMARY OF THE INVENTION

An object of the present invention is to solve the above-mentioned drawbacks of associative memories.

Another object of the present invention is to provide an optical associative memory in which processing data by optical operations permits a shorter processing time and the generation of successive outputs.

These and other objects are achieved by an optical associative memory comprising a reference pattern input device for inputting an electrical reference pattern in the form of an $n \times n$ matrix, a correlation matrix operation device for producing an electrical correlation matrix pattern in the form of an $n^2 \times n^2$ matrix from the electrical reference pattern and an electrical recall pattern produced by a recall pattern processing device, a correlation matrix conversion device for converting the electrical correlation matrix pattern into an optical correlation matrix pattern in the form of an $n^2 \times n^2$ matrix, a correlation matrix storage device for storing the optical correlation matrix pattern converted by the correlation matrix display device, a reference pattern conversion device for converting the electrical reference pattern from the reference pattern input device into an optical reference pattern in the form of an $n \times n$ matrix, a multiple image formation system for converting the optical reference pattern from the reference pattern conversion device into an optical reference pattern in the form of an $n^2 \times n^2$ matrix, a pattern operation device for producing an optical recall pattern in the form of an $n^2 \times n^2$ matrix by multiplying the optical correlation matrix pattern from the correlation matrix storage device and the optical reference pattern output from the multiple image formation system, an inverse multiple image formation system for converting the optical recall pattern from the pattern operation device into an optical recall pattern in the form of an $n \times n$ matrix, a light receiving matrix for converting the optical recall pattern from the inverse multiple image formation system into an electrical recall pattern in the form of an $n \times n$ matrix and a recall pattern processing device for subjecting the recall pattern from the light receiving matrix to a thresholding operation whereby the recall pattern is obtained from the reference pattern after learning with a plurality of reference patterns through optical processing.

BRIEF DESCRIPTION OF THE DRAWINGS

The manner by which the above objects and other objects, features, and advantages of the present invention are attained will be apparent from the following detailed description when it is considered in view of the drawings, wherein:

FIGS. 5(A) and 5(B) are diagrams showing an example of an enlarged image formation system;

FIGS. 6(A) and 6(B) are diagrams showing an example of a multiple image formation system; and FIGS. 7(A) and 7(B) are diagrams showing an example of a single image formation system.

DETAILED DESCRIPTION

Figure 1:
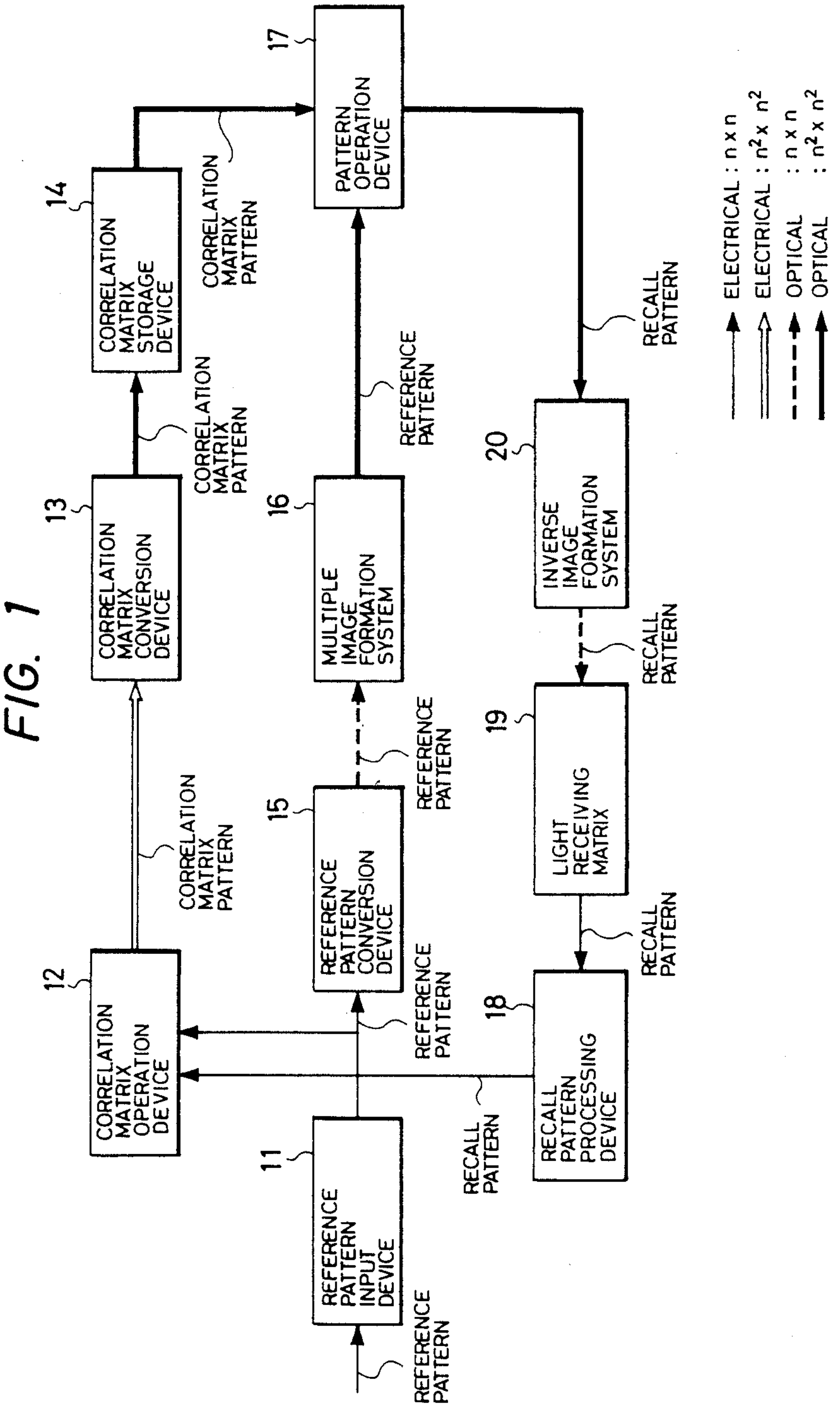
FIG. 1 is a block diagram of an embodiment of an optical associative memory according to the present invention.

An optical associative memory according to the present invention converts a correlation matrix pattern, obtained from a reference pattern through electrical operation, into an optical pattern and stores the optical pattern. An optical recall pattern is produced through optical matrix operations on the basis of the optical pattern stored and the reference pattern. The optical recall pattern is then converted into an electrical recall pattern, and is fed back with a predetermined learning gain to produce a correlation matrix pattern from the electrical recall pattern and the autocorrelation of the reference pattern. The correlation matrix of the reference pattern is memorized by repeating sequentially the above-mentioned process.

The optical associative memory according to the present invention converts the electrical reference pattern into the optical reference pattern, and then produces an optical recall pattern through optical matrix operation on the basis of this optical reference pattern and the stored correlation matrix pattern. Thus, a complete pattern can be recalled from an incomplete reference pattern by converting the optical recall pattern into the electrical recall pattern.

The principles of an optical associative memory according to the present invention will first be described as follows. The present invention employs an autocorrelation matrix for implementing associative storage in which a memory matrix is formed through autocorrelation of the content to be stored. The operation in memory is expressed by the following equation:

$$M = \Sigma x \cdot x' \quad (1)$$

where x is an input vector indicative of the content to be stored, x' is the transpose vector of x, and M is a memory matrix. That is, the autocorrelation of the content to be stored is obtained and then M is obtained by adding this autocorrelation over and over again.

When recalling information, operating with the storage matrix M permits the recall of an entire information set through the use of only a portion thereof. The recall operation is expressed by the following equation:

$$y = \phi(M \cdot i\ x) \quad (2)$$

where y represents an output vector, x an input vector, and $\phi$ a thresholding operation. Even when x is incomplete, i.e., missing some portion of the data, by means of the M·x, operation of recall data y close to the original data x can be obtained with the missing portion recovered. Additionally, data having higher than a predetermined level of quality is collected through thresholding operation of $\phi$ thereby eliminating noise portions.

In recall in accordance with a memory matrix obtained from Eq. (1) above, the following sequential calculation method is utilized if separation is not sufficient. In the method, the memory matrix is formed for better separation as follows.

$$M_{n+l} = M_n + a(x - \phi(M_n \cdot x))x' \quad (3)$$

where a is a learning gain. $M_{n+l}$ is the (n+1)th value of M, and can be obtained by modifying $M_n$ with the correlation between x' and a recall error component. The correlation, called learning pattern, is multiplied by a learning gain a, and the recall error component is the difference between x and $\phi(M_n \cdot x)$. The learning gain a is selected such that $M_n$ converges. Thus, operating in accordance with Eq. (3) until $M_n$ converges provides the correlation matrix with an improved separation.

Figure 3:
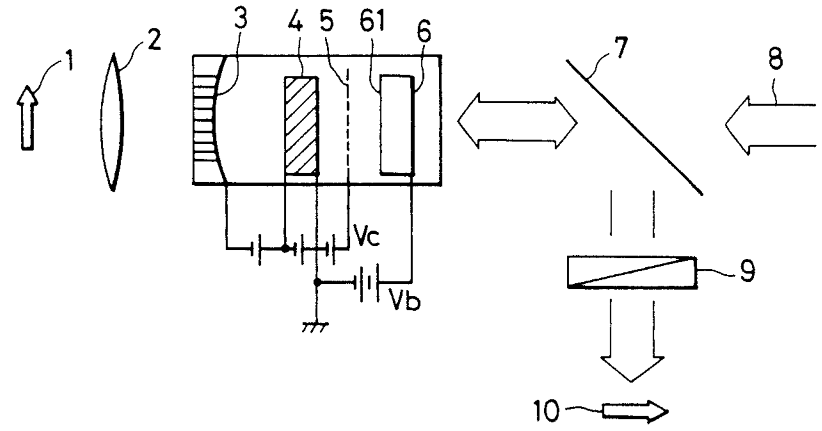
FIG. 3 is a diagram for illustrating an arrangement of a spatial light modulation tube that is a fundamental structural element of the optical associative memory according to the present invention.

FIG. 3 is a diagram for illustrating the arrangement and operation of a spatial light modulation tube, which is a fundamental structural element of an optical associative memory according to the present invention. An input image 1 is imaged by a lens 2 onto a photocathode 3. The electrons emitted from the photocathode 3 pass through a microchannel plate 4, a mesh electrode 5, and strike a charge storage surface 61 of a crystal 6. A half mirror 7 is provided in the optical path between the crystal 6 and a monochromatic light source 8. An output image 10 is formed from light passing through an analyzer 9.

In FIG. 3, the input image 1 incident upon the photocathode 3 of the spatial light modulation tube through the lens 2 is converted into a photoelectron image. This photoelectron image is multiplied at the microchannel plate 4, and forms a charge pattern on the charge storage surface 61 of the crystal 6. The electric field transverse to the crystal 6 varies in response to the charge pattern to cause the index of refraction of the crystal 6 to vary due to the Pockels effect. When linearly deflected monochromatic light from the light source 8 is applied to the crystal 6, the light reflected by the charge storage surface 61 is deflected differently due to birefringence of the crystal 6 and the output image 10 will have a light intensity in accordance with the light intensity of the input image 1 if the light reflected by the charge storage surface 61 is allowed to pass through the analyzer 9. The major functions of the spatial light modulation tube associated with the present invention are storage, subtraction, and thresholding, which will described as follows.

(A) Storage function

A spatial light modulation tube provides a storage function for maintaining charge distribution on the surface of an electrooptic crystal for an extended period of time. The crystal 6 exhibits a very high electrical resistance, and thus the charge distribution on the charge storage surface 61 can be maintained for more than several days.

(B) Subtraction function

Figure 4:
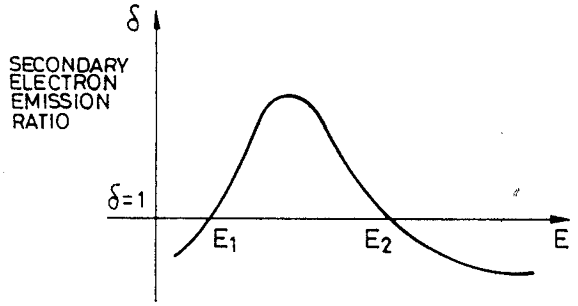
FIG. 4 is a diagram for showing the property of secondary electron emission from the crystal surface of the spatial light modulation tube of FIG. 3.

The spatial light modulation tube can form selectively positive or negative charge distribution on the surface of the electrooptic crystal. FIG. 4 is a graph for showing the property of secondary electron emission of an electrooptic crystal. A shown in FIG. 4, if a primary electron energy E incident upon the charge storage surface 61, is either smaller than a first crossover point E1 or larger than a second crossover point E2, then the crystal surface is negatively charged since the number of the primary electrons is larger than that of the secondary electrons emitted from the crystal surface ($\delta < 1$). If the energy of the primary electrons is between E1 and E2, then the number of the secondary electrons is larger than that of the primary electrons ($\delta > 1$) and the crystal surface is thus positively charged.

Writing data based on positively and negatively charged potential is effected by controlling the voltage of Vc and Vb as shown in FIG. 3. The subtraction function is implemented by either charging the crystal surface negatively and then writing a positive charge on the surface or first charging the crystal surface positively and then writing a negative charge on the crystal surface The degree of subtraction can be controlled by varying the light intensity when it is incident, varying the duration of the voltage applied to the microchannel plate 4, or varying the magnitude of the voltage applied to the microchannel plate 4.

(C) Thresholding-adjusting function

A real time thresholding operation is controlled by adjusting the voltages Vb and Vc. When the voltage Vb, shown in FIG. 3, is decreased the potential of the charge storage surface 61 also decreases. The voltage Vc of the mesh electrode 5 is set to low voltage of about 0.1 kV. When the Vb is decreased below 0.1 kV, the surface 61 of the crystal 6 becomes negative, thus electrons cannot reach the surface 61. However, if the Vb is gradually decreased in ramp, then the electrons in accordance with intensity of the light incident can reach the crystal surface 61 to thereby decrease the potential of the crystal surface 61. Depending on the amount of electrons that reach the surface 61, that is light intensity incident upon the surface 61, some portion of the crystal surface 61 will be negative, and writing information is thus not effected On the other hand, the other portions of the crystal surface will not be negative, writing information is thus effected. In other words, threshold operation is effected in accordance with the intensity of the light incident.

The other elements constituting the present invention will be described as follows.

(1) Enlarged image formation system

Such an input image pattern of 2×2 as shown in FIG. 5(A) is projected in enlargement into such a 4×4 image pattern as shown in FIG. 5(B). This is actually effected through a lens system for example.

(2) Multiple image formation system

Such an input image pattern of 2×2 as shown in FIG. 6(A) is projected through a lens array including lenses arranged two-dimensionally into a pattern as shown in FIG. 6(B), the number of 2×2 patterns in the pattern of FIG. 6(B) corresponding to the number of lenses in the array. Examples of such a lens array are fly's eye lens plate, a planar microlens array and a lens array arranged on Fresnels' zone plate which are well-known in the art or are commercially available.

(3) Inverse multiple image formation system

Such an input image pattern of 4×4 as shown in FIG. 7(A) is projected, in superposition, into 2×2 image as shown in FIG. 7(B). The projection is actually effected through an optical system using the above described lens array.

An optical associative memory, according to the present invention, to which the aforementioned spatial light modulation tube is applied, will now be described. FIG. 1 is a block diagram showing an embodiment of an optical associative memory according to the invention, which comprises a reference pattern input device 11, a correlation matrix operation device 12, a correlation matrix conversion device 13, a correlation matrix storage device 14, a reference pattern conversion device 15, a multiple image formation system 16, a pattern operation device 17, a recall pattern processing device 18, a light receiving matrix 19 and an inverse multiple image formation system 20.

In FIG. 1, thin lines with arrows and dual lines with arrows indicate the flow of electrical pattern signals. Dotted lines with arrows and thick solid lines with arrows indicate the flow of optical pattern signals. The contents to be stored or content to be read out, for example x, is input into the reference pattern input device 11. The correlation matrix operation device 12 performs a correlation matrix operation between x and transpose matrix x', or between a recall pattern and x'. The multiple image formation system 16 and the inverse multiple image formation system 20 perform conversion of the order of the matrix. The correlation matrix conversion device 13 and the reference pattern conversion device 15 convert an electrical pattern signal into an. optical pattern signal. The light receiving matrix 19 converts the optical pattern signal into an electrical pattern signal. The correlation matrix storage device 14 stores a correlation matrix, and the pattern operation device 17 performs an operation on the basis of the reference pattern and a correlation matrix pattern to output the recall pattern.

Operation of the memory will now be described as follows. The operation is carried out in accordance with Eq. (3). The electrical pattern to be stored, in the form of n×n matrix, is input through the reference pattern input device 11. The autocorrelation operation of the electrical pattern is performed in the correlation matrix operation device 12 to produce an electrical autocorrelation matrix pattern in the form of $n^2 \times n^2$ matrix. This electrical correlation matrix pattern is converted into the optical pattern signal in the correlation matrix conversion device 13, which optical pattern signal is stored in the correlation matrix storage device 14. It should be noted that the autocorrelation matrix of an input electrical reference pattern X represents an electrical correlation matrix pattern Y. That is, an equation $Y = X \cdot X^T$ is established where $X^T$ is a transpose vector of the input electrical reference pattern X.

The output of the reference pattern input device 11 is also converted into an optical pattern in the reference pattern conversion device 15, and is further converted into the optical pattern in the form of $n^2 \times n^2$ matrix in the multiple image formation system 16 to be applied to the pattern operation device 17.

In the pattern operation device 17, a multiplication operation is performed between the correlation matrix (optical pattern signal) from the device 14 and the optical pattern from the device 16 to output an optical recall pattern in the form of an $n^2 \times n^2$ matrix. This optical recall pattern is converted into an optical recall pattern in the form of an n×n matrix in the inverse multiple image formation system 20. This optical recall pattern is further converted into an electrical recall pattern in the form of an n×n matrix in the light receiving matrix 19. The recall pattern from the matrix 19 is then subjected to a thresholding operation in the recall pattern processing device 18. The recall pattern obtained in this manner is supplied to the correlation matrix operation device 12. In the device 12, the thus obtained recall pattern is multiplied by the reference pattern. The recall pattern, together with the autocorrelation matrix obtained in a similar manner to the above-described process, is multiplied by a learning gain in the correlation matrix storage device 14, and then is subjected to addition or subtraction. The operation described above is repeated to form the correlation matrix M until the correlation matrix converges.

The recall operation will now be described as follows. The reference pattern is converted into the electrical reference pattern in the form of an n×n matrix by the reference pattern input device 11, and then is further converted, in the reference pattern conversion device 15, to the optical reference pattern in the form of an n×n matrix, which in turn is converted into the optical reference pattern in the form of $n^2 \times n^2$ matrix in the multiple image formation system 16. In the pattern operation device 17, an operation is performed to produce the optical recall pattern in the form of an $n^2 \times n^2$ matrix on the basis of an optical reference pattern in the form of an $n^2 \times n^2$ matrix and the optical correlation matrix pattern in the form of $n^2 \times n^2$ matrix from the device 14. The thus obtained optical recall pattern is converted into the optical recall pattern in the form of n×n matrix in the system 20 and further is converted into the electrical recall pattern in the form of an n×n matrix by the light receiving matrix 19, so that the device 18 produces a final recall pattern An embodiment of the optical system of an optical associative memory according to the present invention will be described with reference to FIG. 2.

Figure 2:
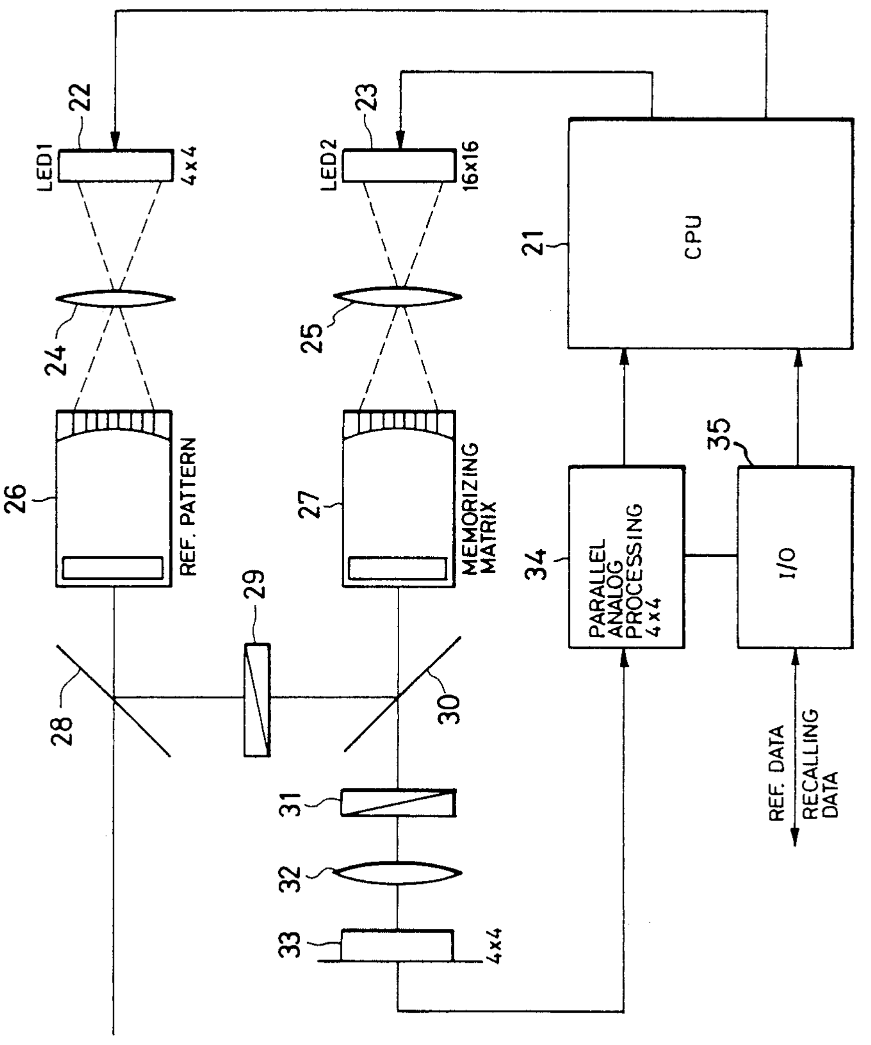
FIG. 2 is a diagram of an embodiment of the actual optical system of the optical associative memory according to the present invention.

As shown in FIG. 2, the optical system includes a CPU 21, LEDs array 22 and 23, a multiple image formation system 24, a lens system 25, spatial light modulation tubes 26 and 27, half mirrors 28 and 30, analyzers 29 and 31, an inverse multiple image formation system 32, a light receiving matrix 33, a parallel analog processing circuit 34 and an input/output port 35. These devices are arranged to act as the corresponding devices in FIG. 1. That is, the CPU 21 is arranged to act as the correlation matrix operation device 12, and the reference pattern input device 11. The LED array 22 (4×4) acts as the reference pattern conversion device 15 and the LED array 23 (16×16) acts as the correlation matrix conversion device 13. The spatial light modulation tube 27 acts as the correlation matrix storage device 14. The pattern operation device 17 is implemented by reading the data from the spatial light modulation tube 26 and the spatial light modulation tube 27 successively. The light receiving matrix 33 (PTR (phototransistor) array, 16×16) corresponds to the light receiving matrix 19. The parallel analog processing circuit 34 (4×4) is arranged to act as the recall pattern processing device 18.

Figure 8:
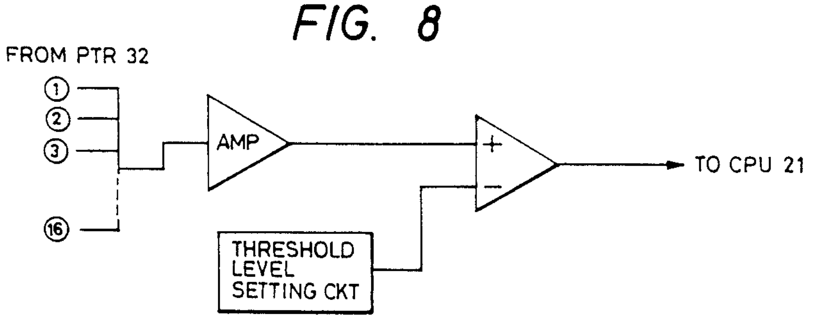
FIG. 8 is a circuit diagram showing an example of a parallel analog processing circuit 33 shown in FIG. 2.

An example of the parallel analog processing circuit 34 is shown in FIG. 8. In FIG. 8, 16 (4×4) input signals from the PTR 33 are received in parallel mode to be summed. The summation signal is amplified to have a sufficient signal level, and is then applied to an operational amplifier where the amplified signal is subjected to comparison with a threshold level. A digital signal representing the comparison result is applied to the CPU 21.

As mentioned above, the optical associative memory is arranged by combining electronic circuits and optical devices. The following is a description of how an optical associative storage device operates.

The (4×4) reference data is read into the CPU 21 through the input/output port 35. The CPU converts the order of the data in the form of matrix and performs the autocorrelation operation. The CPU outputs the reference pattern to the LED array 22 and the correlation matrix pattern to the LED array 23. The reference pattern and the correlation matrix pattern are converted into the (16×16) optical reference pattern and the (16×16) optical recall pattern, respectively, which are stored in the spatial light modulation tube 26 and the spatial light modulation tube 27 through the multiple image formation system 24 and the lens 25, respectively.

The reference pattern stored in the spatial light modulation tube 26 is read by means of a monochromatic light, provided through the half mirror 28. The light reflected by the half mirror 28 is imaged through the analyzer 29 and the half mirror 30 on the spatial light modulation tube 27 to read the content stored therein. Through this process, multiplication of the reference pattern by the correlation matrix pattern occurs to produce the recall pattern. The recall pattern is converted into the (4×4) pattern in the multiple image formation system 32. The pattern is then converted into the electrical recall pattern in the light receiving matrix 33. The parallel analog processing circuit converts the order of this matrix and executes a thresholding operation. In this manner, both the recall pattern and the reference pattern are received into the CPU 21. Then, the CPU 21 calculates a recall error component from the recall pattern and the reference pattern, and also calculates the learning pattern from the reference pattern and the recall error component. The CPU 21 outputs the learning pattern to be added into the spatial light modulator 27 by positive charge mode. The negative component of the learning pattern is subtracted from the spatial light modulator 27 by negative charge mode. Thereafter the aforementioned process is repeated to store the correlation matrix into the spatial light modulation tube 27.

Operation in recall mode will be described as follows.

The recall data is read into the CPU 21 through the input/output port 35, and the order thereof is converted by the CPU 21. The recall data is then converted into an optical reference pattern in the LED array 22 to be inputted into the spatial light modulation tube 26 from which a reference pattern is read out, as described above, and multiplied by the correlation matrix stored in the spatial light modulation tube 27 to obtain the recall pattern. The electrical recall pattern is obtained from the recall pattern in the light receiving matrix 33 after the conversion of the order in the inverse multiple image formation system. Then, the thresholding operation of the recall pattern is carried out in the parallel analog processing circuit to obtain the electrical recall pattern. Thus, a complete recall pattern may be obtained from the stored correlation matrix and an incomplete reference pattern.

Although the above discussion has been made in connection with an embodiment using a spatial light modulation tube, it should not be interpreted in a limiting sense. Modifications may, of course, be made to the disclosed embodiment by using similar optical devices.

Unlike memory devices for computers such as conventional associative memories that are intended for electrical digital signals, the optical associative memory according to the invention as described, does not require a scan operation for pattern information and can replace the usual electrical processing by optical ones. Thus, the present invention reduces significantly the process time required and permits successive outputs. Consequently, applications in the field of optical retrieval devices are made possible.

What is claimed is:

1. An optical associative memory comprising:

a reference pattern input device for inputting an electrical reference pattern in the form of an n×n matrix;

a correlation matrix operation device for producing an electrical correlation matrix pattern in the form of an $n^2 \times n^2$ matrix from said electrical reference pattern and an electrical recall pattern produced by a recall pattern processing device;

a correlation matrix conversion device for converting said electrical correlation matrix pattern into an optical correlation matrix pattern in the form of an $n^2 \times n^2$ matrix;

a correlation matrix storage device for storing said optical correlation matrix pattern converted by said correlation matrix display device;

a reference pattern conversion device for converting said electrical reference pattern from said reference pattern input device into an optical reference pattern in the form of an n×n matrix;

a multiple image formation system for converting said optical reference pattern from said reference pattern conversion device into an optical reference pattern in the form of an $n^2 \times n^2$ matrix;

a pattern operation device for producing an optical recall pattern in the form of an $n^2 \times n^2$ matrix by multiplying said optical correlation matrix pattern from said correlation matrix storage device and said optical reference pattern output from said multiple image formation system;

an inverse multiple image formation system for converting said optical recall pattern from said pattern operation device into an optical recall pattern in the form of an n×n matrix;

a light receiving matrix for converting said optical recall pattern from said inverse multiple image formation system into an electrical recall pattern in the form of an n×n matrix; and a recall pattern processing device for subjecting said recall pattern from said light receiving matrix to a thresholding operation whereby said recall pattern is obtained from said reference pattern after learning with a plurality of reference patterns through optical processing.

2. An optical associative memory according to claim 1, wherein said correlation matrix operation device, said reference pattern input device, and said reference pattern conversion device comprise a programmed computer.

3. An optical associative memory according to claim 1, wherein said reference pattern conversion device comprises a first array of light emitting diodes.

4. An optical associative memory according to claim 1, wherein said correlation matrix conversion device comprises a second array of light emitting diodes.

5. An optical associative memory according to claim 1, wherein said correlation matrix storage device comprises a second spatial light modulation tube.

6. An optical associative memory according to claim 1, wherein said pattern operation device comprises means for reading data from a first spatial light modulation tube and said second spatial light modulation tube successively.

7. An optical associative memory according to claim 6, wherein said reading means comprises:
- first and second half mirrors;
- a first image analyzer between said first and second half mirrors; and
- a source of monochromatic light.

8. An optical associative memory according to claim 1, wherein said light receiving matrix comprises an array of phototransistors.

9. An optical associative memory according to claim 1, wherein said recall pattern processing device comprises a parallel analog processing circuit.

10. An optical associative memory according to claim 1, wherein said multiple image formation system and said inverse multiple image formation system comprise lens arrays, respectively, each of said lens arrays including a plurality of lenses arranged two-dimensionally.

11. An optical associative memory storage method comprising the steps of:
- inputting through a reference pattern input device an electrical reference pattern in the form of an $n \times n$ matrix;
- forming an electrical correlation matrix pattern in a correlation matrix operation device in the form of an $n^2 \times n^2$ matrix from said electrical reference pattern and an electrical recall pattern produced by a recall pattern processing device;
- converting said electrical correlation matrix pattern in a correlation matrix conversion device into an optical correlation matrix pattern in the form of an $n^2 \times n^2$ matrix;
- storing said optical correlation matrix pattern converted by said correlation matrix display device in a correlation matrix storage device;
- converting in a reference pattern conversion device said electrical reference pattern from said reference pattern input device into an optical reference pattern in the form of an $n \times n$ matrix;
- converting in a multiple image formation system said optical reference pattern from said reference pattern conversion device into an optical reference pattern in the form of an $n^2 \times n^2$ matrix;
- producing in a pattern operation device an optical recall pattern in the form of an $n^2 \times n^2$ matrix by multiplying said optical correlation matrix pattern from said correlation matrix storage device and said optical reference pattern output from said multiple image formation system;
- converting in an inverse multiple image formation system said optical recall pattern from said pattern operation device into an optical recall pattern in the form of an $n \times n$ matrix; and
- converting in a light receiving matrix said optical recall pattern from said inverse multiple image formation system into an electrical recall pattern in the form of an n x n matrix; and
- subjecting in a recall pattern processing device said electrical recall pattern from said light receiving matrix to a thresholding operation.

* * * * *

UNITED STATES PATENT AND TRADEMARK OFFICE

CERTIFICATE OF CORRECTION

PATENT NO. : 4,974,202

DATED : November 27, 1990

INVENTOR(S) : Naohisa Mukohzaka

It is certified that error appears in the above-identified patent and that said Letters Patent is hereby corrected as shown below:

In the Abstract, Line 14, change "information" to --formation--;

Column 3, Line 15, change "M•i x" to --M•X--;

Column 3, Line 31, change "a(x" to --α(x--;

Column 3, Line 33, after "where" change "a" to --α--;

Column 3, Line 37, after "gain" change "a" to --α--;

Column 3, Line 38, after "gain" change "a" to --α--;

UNITED STATES PATENT AND TRADEMARK OFFICE

CERTIFICATE OF CORRECTION

PATENT NO. : 4,974,202

DATED : November 27, 1990

INVENTOR(S) : Naohisa Mukohzaka

It is certified that error appears in the above-identified patent and that said Letters Patent is hereby corrected as shown below:

Column 4, Line 19, change "A" to --As--;

Claim 11, Column 10, Line 12, change "$n^{2xn2}$" to --$n^2$ x $n^2$;

Claim 11, Column 10, Line 33, after " ; " delete "and".

Signed and Sealed this

Tenth Day of November, 1992

Attest:

DOUGLAS B. COMER

*Attesting Officer*

*Acting Commissioner of Patents and Trademarks*